(12) United States Patent
Wang et al.

(10) Patent No.: US 7,889,104 B2
(45) Date of Patent: Feb. 15, 2011

(54) DIGITAL TO ANALOG CONVERTER

(75) Inventors: Wei-Ping Wang, Taipei (TW); Chih-Yuan Hsu, Taipei (TW)

(73) Assignee: Ali Corporation, Taipei (TW)

( * ) Notice: Subject to any disclaimer, the term of this patent is extended or adjusted under 35 U.S.C. 154(b) by 11 days.

(21) Appl. No.: 12/487,703

(22) Filed: Jun. 19, 2009

(65) Prior Publication Data

US 2010/0079320 A1 Apr. 1, 2010

(30) Foreign Application Priority Data

Sep. 28, 2008 (CN) .................. 2008 1 0166006

(51) Int. Cl.
*H03M 1/10* (2006.01)
(52) U.S. Cl. ..................... 341/120; 341/144
(58) Field of Classification Search .......... 341/120, 341/121, 144
See application file for complete search history.

(56) References Cited

U.S. PATENT DOCUMENTS

| | | | |
|---|---|---|---|
| 4,222,107 A | 9/1980 | Mrozowoski et al. | |
| 5,955,980 A * | 9/1999 | Hanna | 341/120 |
| 6,130,632 A * | 10/2000 | Opris | 341/120 |
| 6,157,332 A | 12/2000 | Frank et al. | |
| 6,667,703 B1 | 12/2003 | Reuveni et al. | |

* cited by examiner

*Primary Examiner*—Brian Young
(74) *Attorney, Agent, or Firm*—Thomas, Kayden, Horstemeyer & Risley

(57) ABSTRACT

A digital to analog converter (DAC) converting a digital code to an output voltage and capable of self calibration. The DAC includes a self-calibration signal generator generating a self-calibration signal based on the output voltage, a constant current generator, a first and a second current provider and a current-voltage converter. The current generating elements of the first and second current providers provide proportional currents, and are enabled/disabled according to the self-calibration signal and the digital code, respectively. The constant current is divided into the actual working current generating elements of the first current provider, and an output current is generated by the actual working current generating elements of the second current provider. The output current is converted to the output voltage by the current-voltage converter.

9 Claims, 5 Drawing Sheets

DIGITAL TO ANALOG CONVERTER

CROSS REFERENCE TO RELATED APPLICATIONS

This Application claims priority of China Patent Application No. 200810166006.0 filed on Sep. 28, 2008, the entirety of which is incorporated by reference herein.

BACKGROUND OF THE INVENTION

1. Field of the Invention

The present invention relates to digital to analog converters (DACs), and in particular relates to DACs with self-calibration functions.

2. Description of the Related Art

FIG. 1 depicts a conventional DAC 100, which converts a digital code $D_{in}$ to an analog value (output voltage $V_{out}$). As shown in the figure, a voltage $V_{ref}$ is forced to a resistor R to determine a current $I_{pd}$. The current $I_{pd}$ is provided by a transistor $M_1$, wherein the gate voltage $V_{con}$ is coupled to the gates of the transistors $M_{21}$-$M_{2n}$ to drive the transistors $M_{21}$-$M_{2n}$ to generate currents. According to the digital code $D_{in}$, a switching circuit 102 selectively couples the transistors $M_{21}$-$M_{2n}$ to a current to voltage converter (realized by a resistor $R_{out}$). The output current $I_{out}$ is dependent on the digital code $D_{in}$. Because the value of the output voltage $V_{out}$ is a product of the output current $I_{out}$ and the resistor $R_{out}$ and the output current $I_{out}$ is dependent on the digital code $D_{in}$, the output voltage $V_{out}$ reacts to the digital code $D_{in}$.

However, process variations during the IC manufacturing process, such as the channel length/width mismatch, mobility mismatch or threshold voltage mismatch, may affect the accuracy of digital to analog conversion.

U.S. Pat. No. 6,157,332 discloses DACs with self-calibration functions, as shown in FIG. 2. During the self-calibration process, the digital code $D_{in}$ is of a specific value, the control logic 202 generates a self-calibration signal 204 to turn on the switch 206 and to turn off the switch 208. The amplitude detector 210 detects an output voltage $V_{out}$ from an n-bit DAC 212 to generate an UP signal 214 and a DOWN signal 216 to control the charge pump 218 to charge or discharge the capacitor 220, so that the voltage $V_{ref}$ is adjusted and the output voltage $V_{out}$ is affected.

For the DAC of the U.S. Pat. No. 6,157,332, however, current leaks out of the capacitor 220. Thus, the self-calibration procedure has to be periodically repeated to maintain the accuracy of the voltage value $V_{ref}$. The demand for periodic self-calibrations, limits applicability of the DACs in electronic devices with periodic synchronization periods, such as a video display device. Furthermore, circuitry for the charge pump 218 and the selective output signal coupler 222 of the DAC is complicated, leading to relatively higher costs.

BRIEF SUMMARY OF THE INVENTION

The invention provides a digital to analog converter (DAC), which is operated to convert a digital code to an output voltage, capable of self-calibration. An exemplary embodiment of the DAC of the invention comprises a self-calibration signal generator, a constant current generator, a first and a second current provider, and a current to voltage converter. The self-calibration signal generator receives the output voltage to generate the self-calibration signal. When the DAC is in a self-calibration mode, the number of the actual working elements among the first current generating elements of the first current provider is determined by the self-calibration signal. The constant current generator generates a constant current to be divided into the actual working first current generating elements. The second current generator comprises a plurality of second current generating elements. The number of the actual working second current generating elements is determined by a digital code received by the DAC, and then an output current is generated by the actual working second current generating elements. The current to voltage converter converts the output current to the output voltage. The currents generated by the first and second current generating elements are proportional to each other.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 3:
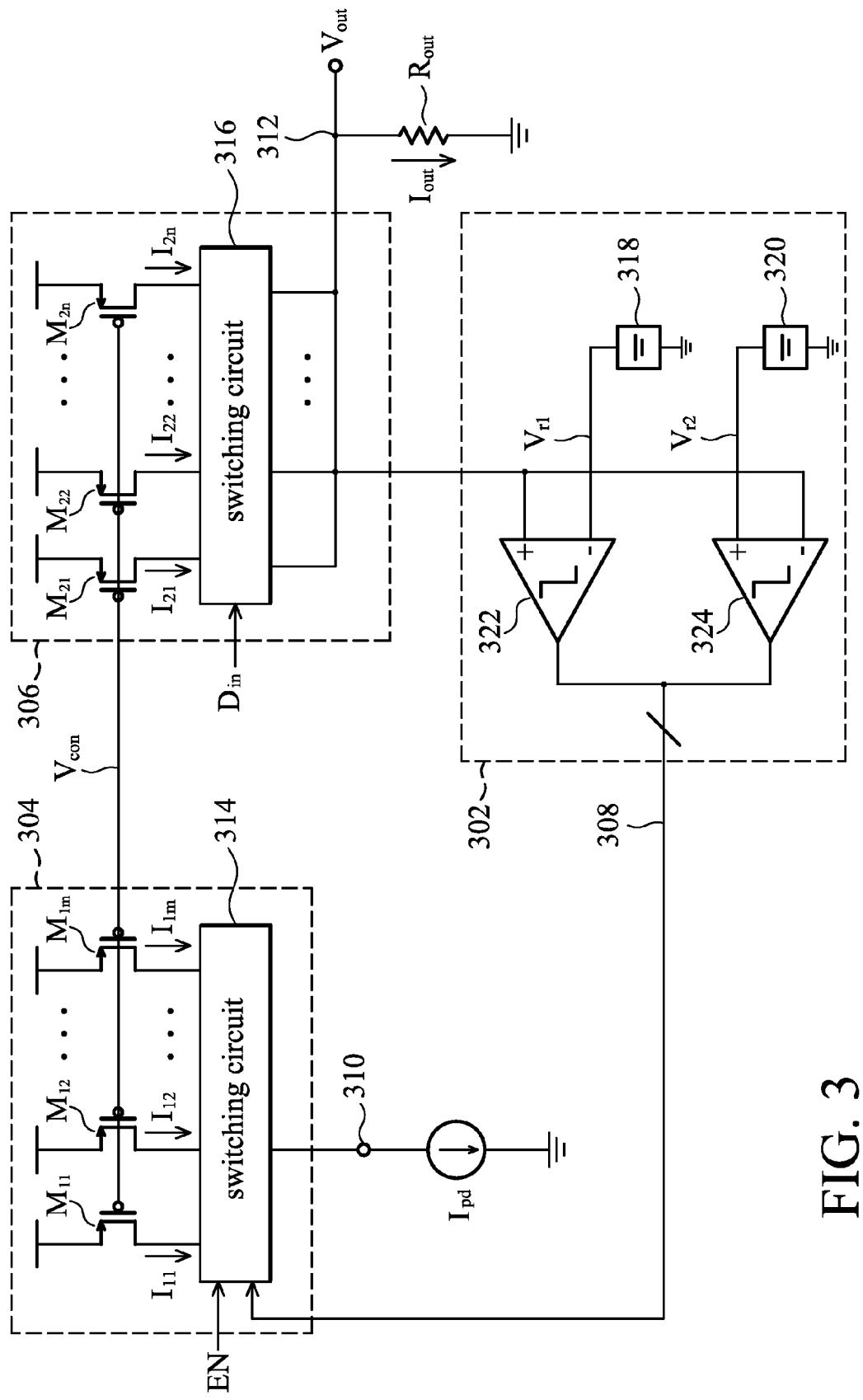
FIG. 3 depicts an exemplary embodiment of the DACs of the invention.

FIG. 3 depicts an exemplary embodiment of the DACs of the invention. The DAC converts a digital code $D_{in}$ to an output voltage $V_{out}$ and is capable of self-calibration. The DAC comprises a self-calibration signal generator 302, a constant current generator (generating a constant current $I_{pd}$), a first current provider 304, a second current provider 306, and a current to voltage converter (in this embodiment, realized by a resistor $R_{out}$).

The first current provider 304 comprises a plurality of first current generating elements $M_{11}$, $M_{12}$ ... $M_{1m}$. The second current provider 306 comprises a plurality of second current generating elements $M_{21}$, $M_{22}$ ... $M_{2n}$. The first and second current generating elements $M_{11}$, $M_{12}$ ... $M_{1m}$ and $M_{21}$, $M_{22}$ ... $M_{2n}$ provide proportional currents. In this embodiment of FIG. 3, the current generating elements $M_{11}$, $M_{12}$ ... $M_{1m}$ and $M_{21}$, $M_{22}$ ... $M_{2n}$ are realized by MOSFETs, wherein the sources of the MOSFETS are coupled to a voltage source and the gates of the MOSFETs are coupled together. The voltage level of the gates of the MOSFETs is the control voltage $V_{con}$.

The number of the actual working elements among the first current generating elements $M_{11}$, $M_{12}$ ... $M_{1m}$ is adjusted by a self-calibration signal 308 when the DAC is in a self-calibration mode. The constant current $I_{pd}$ is divided into the actual working first current generating elements. The number of the actual working elements among the second current generating elements $M_{21}$, $M_{22}$ ... $M_{2n}$ is determined by the digital code $D_{in}$, and an output current $I_{out}$ is generated accordingly. Because the output current $I_{out}$ varies with the digital code $D_{in}$, the output voltage $V_{out}$ generated by the current to the voltage converter $R_{out}$ reacts to the digital code $D_{in}$. The DAC shown in FIG. 3 converts the digital code $D_{in}$ to the output voltage $V_{out}$ that is in an analog form.

To improve the accuracy of analog to digital conversion, this embodiment sends the output voltage $V_{out}$ to the self-calibration signal generator 302 for a comparing procedure, thereafter, generating the self-calibration signal 308. In the self-calibration mode, the number of the actual working elements among the first current generating elements $M_{11}$, $M_{12} \ldots M_{1m}$ is adjusted by the self-calibration signal 308. Because the constant current $I_{pd}$ is divided into the actual working first current generating elements, the currents $I_{11}$, $I_{12} \ldots I_{1m}$ of the first current generating elements $M_{12} \ldots M_{1m}$ and the control voltage $V_{con}$ vary with the number of the actual working first current generating elements. According to the adjustment of the control voltage $V_{con}$, the currents $I_{21}$, $I_{22} \ldots I_{2n}$ are adjusted. Accordingly, the value of the output current $I_{out}$ is adjusted and a more accurate output voltage $V_{out}$ is available. For example, increasing number of the actual working first current generating elements causes decreased currents $I_{11}, I_{12} \ldots I_{1m}$, and decreasing number of the actual working first current generating elements causes increased currents $I_{11}, I_{12} \ldots I_{1m}$.

The embodiment of FIG. 3 alerts the self-calibration mode by a self-calibration enable signal EN. The switching circuit 314 selectively couples the first current generating elements $M_{12} \ldots M_{1m}$ to a node 310, and the selected elements are the actual working first generating elements. The switching circuit 316 selectively couples the second current generating elements to a node 312, and the selected elements are the actual working second generating elements. When the self-calibration enable signal EN is disabled, the DAC is not in the self-calibration mode, and the first switching circuit 314 is fixed and the output voltage $V_{out}$ only reacts to the digital code $D_{in}$. When the self-calibration enable signal EN is enabled, the DAC is in the self-calibration mode, and the first switching circuit 314 acts according to the self-calibration signal 308. Thus, the actual working first current generating elements vary with the self-calibration signal 308 and the output voltage $V_{out}$ is adjusted.

The self-calibration signal generator 302 comprises a reference voltage generator (comprising voltage providers 318 and 320) and a comparing circuit (comprising comparators 322 and 324). The reference voltage generator (comprising the voltage providers 318 and 320) generates an output voltage upper limit $V_{r1}$ and an output voltage lower limit $V_{r2}$ corresponding to the digital code $D_{in}$. The comparing circuit (comprising the comparators 322 and 324) compares the output voltage $V_{out}$ with the output voltage upper and lower limits $V_{r1}$ and $V_{r2}$ to generate the self-calibration signal 308. When the DAC is in the self-calibration mode (the self-calibration enable signal EN is enabled) and the self-calibration signal 308 shows that the output voltage $V_{out}$ is greater than the output voltage upper limit $V_{r1}$, the first switching circuit 314 couples more of the first current generating elements $M_{11}, M_{12} \ldots M_{1m}$ to the first node 310 to increase the number of actual working first current generating elements. When the DAC is in the self-calibration mode (the self-calibration enable signal EN is enabled) and the self-calibration signal 308 shows that the output voltage $V_{out}$ is lower than the output voltage lower limit $V_{r2}$ the first switching circuit 314 breaks with more of the first current generating elements $M_{11}$, $M_{12} \ldots M_{1m}$ from the first node 310 to decrease the number of actual working first current generating elements.

Some exemplary embodiments may set the digital code $D_{in}$ to a specific value when the DAC is in the self-calibration mode (wherein the self-calibration enable signal EN is enabled). For example, the specific value of the digital code $D_{in}$ may be a full scale value, wherein every bit of the digital code Din is data '1'. In other embodiments, the specific value may be other proper values. The output voltage upper and lower limits $V_{r1}$ and $V_{r2}$ may be designed according to the specific value of the digital code $D_{in}$.

Figure 4:
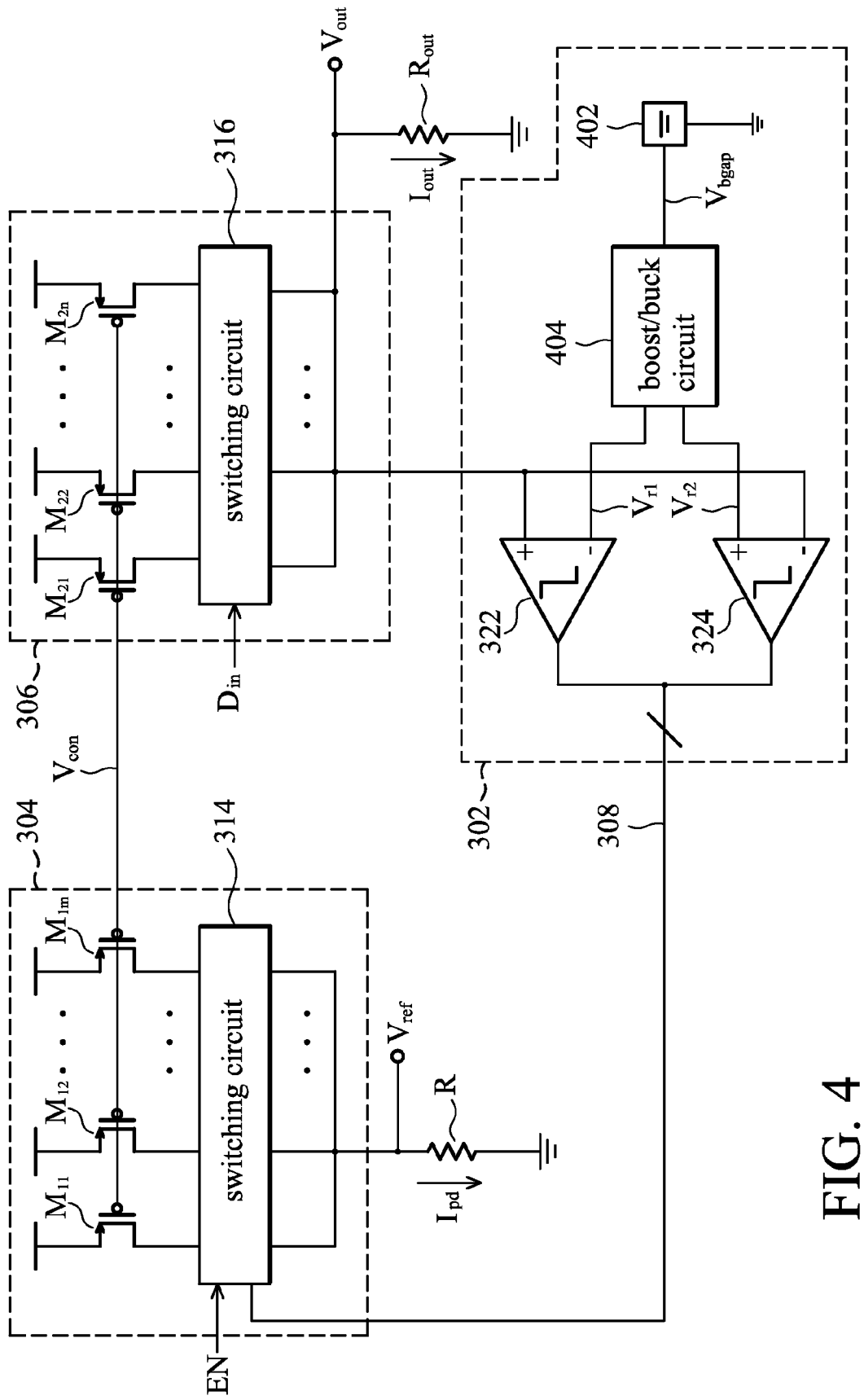
FIG. 4 depicts another exemplary embodiment of the DACs of the invention.

FIG. 4 depicts another exemplary embodiment of the DACs of the invention, wherein the reference voltage generator of the self-calibration signal generator 302 is realized by a bandgap reference generator 402 and a boost/buck circuit 404. The bandgap reference voltage generator 402 generates a bandgap reference voltage $V_{bgap}$. The boost/buck circuit 404 boosts and bucks the bandgap reference voltage $V_{bgap}$ to generate the output voltage upper and lower limits $V_{r1}$ and $V_{r2}$. Because of the steady characteristic of the bandgap reference voltage $V_{bgap}$, the output voltage upper and lower limits $V_{r1}$ and $V_{r2}$ are stable and the reliability of the self-calibration is improved. The output voltage upper limit $V_{r1}$ may be designed to be $(1+E\%) \cdot V_{bgap}$ and the output voltage lower limit $V_{r2}$ may be designed to be $(1-E\%) \cdot V_{bgap}$, where E % represents a percentage of an allowable error and may be set by the user. In the boost/buck circuit 404, the voltage boost may be realized by a charge pump or a boost DC-DC circuit, and the voltage buck may be realized by a low dropout regulator LDO or a buck DC-DC circuit.

FIG. 4 further depicts a technique for setting the value of the constant current $I_{pd}$ by a voltage $V_{ref}$.

It is noted that the reference voltage generator of the self-calibration signal generator 302 is not limited to generating two reference voltages $V_{r1}$ and $V_{r2}$. In other exemplary embodiments, the reference voltage generator may output a single or more than two reference voltages. In such embodiments, the comparing circuit is specially designed accordingly, and a more elaborate control mechanism for the first current generating elements is provided. Thus, the calibration of the output voltage $V_{out}$ can be further improved.

Figure 5:
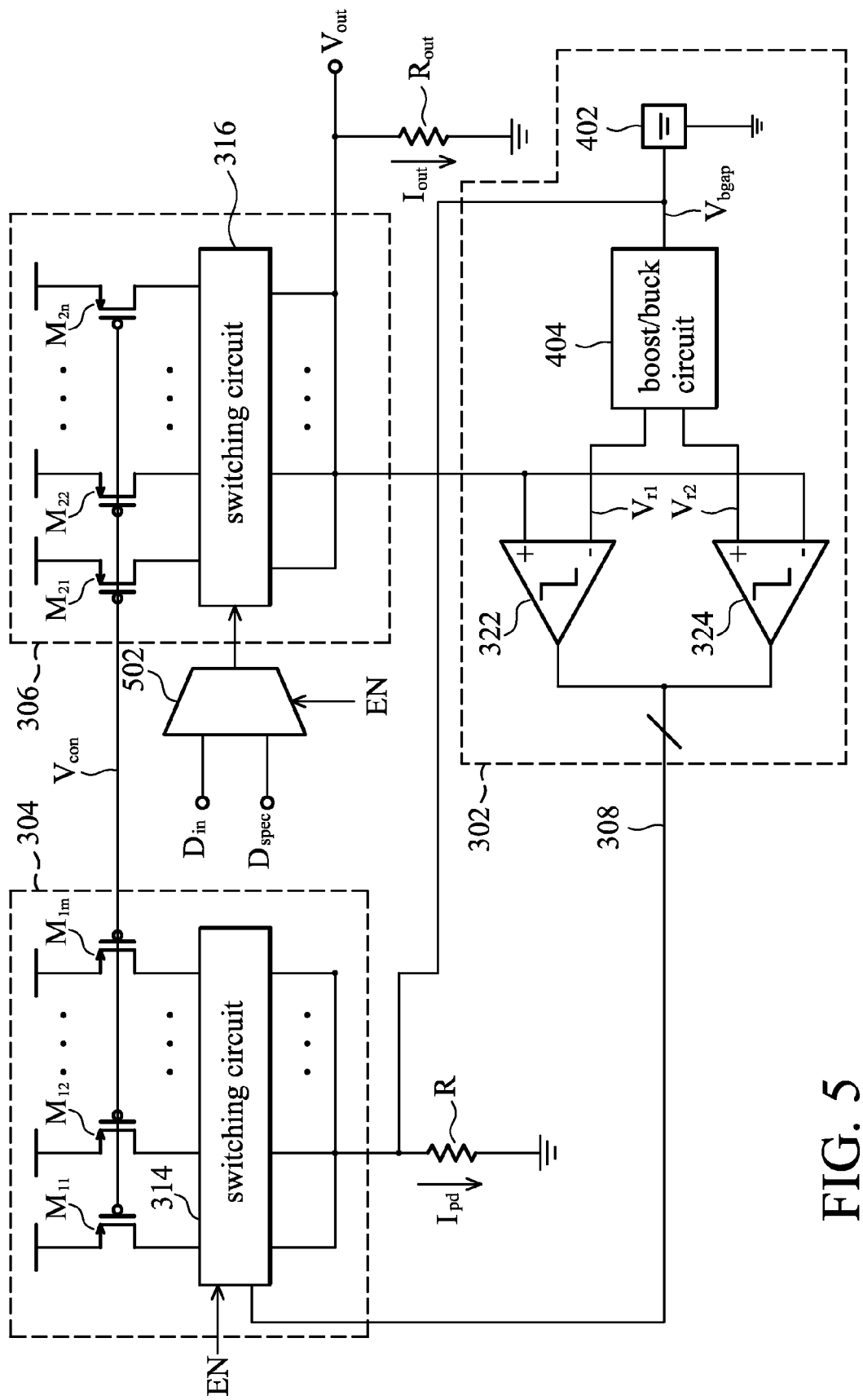
FIG. 5 depicts another exemplary embodiment of the DACs of the invention.

FIG. 5 depicts another exemplary embodiment of the DAC of the invention, wherein, compared with the aforementioned embodiments, the DAC of FIG. 5 further comprises a multiplexer 502. When the self-calibration signal EN is disabled, the DAC is not in the self-calibration mode and the multiplexer 502 couples the digital code $D_{in}$ provided by a previous-stage circuit to the second switching circuit 316. When the self-calibration signal EN is enabled, the DAC is in the self-calibration mode and the multiplexer 502 is switched to couple a specific digital code $D_{spec}$ to the second switching circuit 316 to replace said digital code $D_{in}$. The specific digital code $D_{spec}$ may be a full scale value, wherein every bit is data '1'. In other embodiments, the specific digital code $D_{spec}$ may be designed to be any proper values. FIG. 5 further depicts a technique for generating the constant current $I_{pd}$, wherein the bandgap reference voltage $V_{bgap}$ generated by the bandgap reference voltage generator 402 is coupled to the resistor R to play the role of the reference voltage $V_{ref}$ of FIG. 4. Because of the steady characteristic of the bandgap reference voltage $V_{bgap}$, the constant current $I_{pd}$ is steady and the performance of the DAC is improved.

Figure 1:
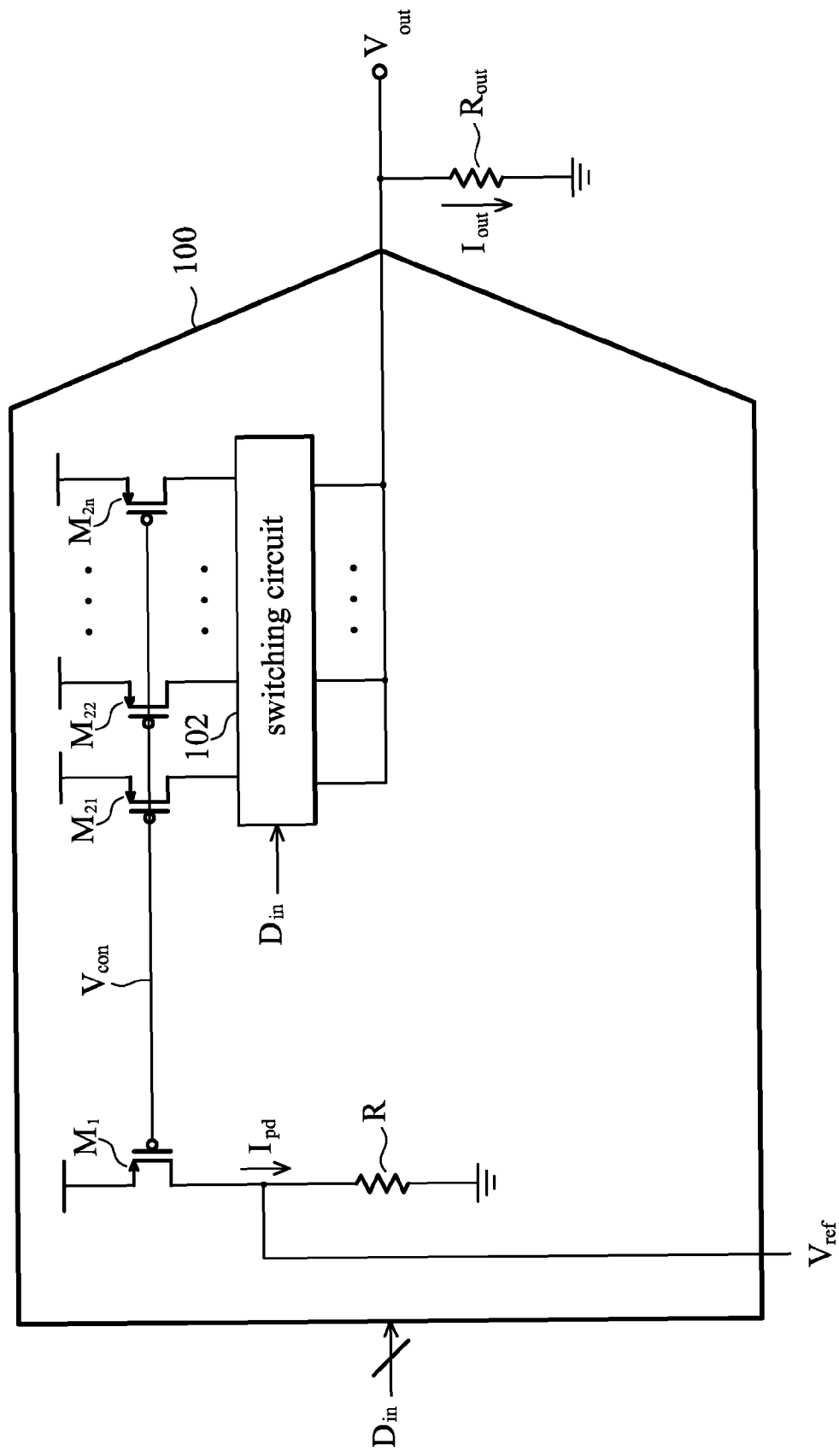
FIG. 1 depicts a conventional DAC.
Figure 2:
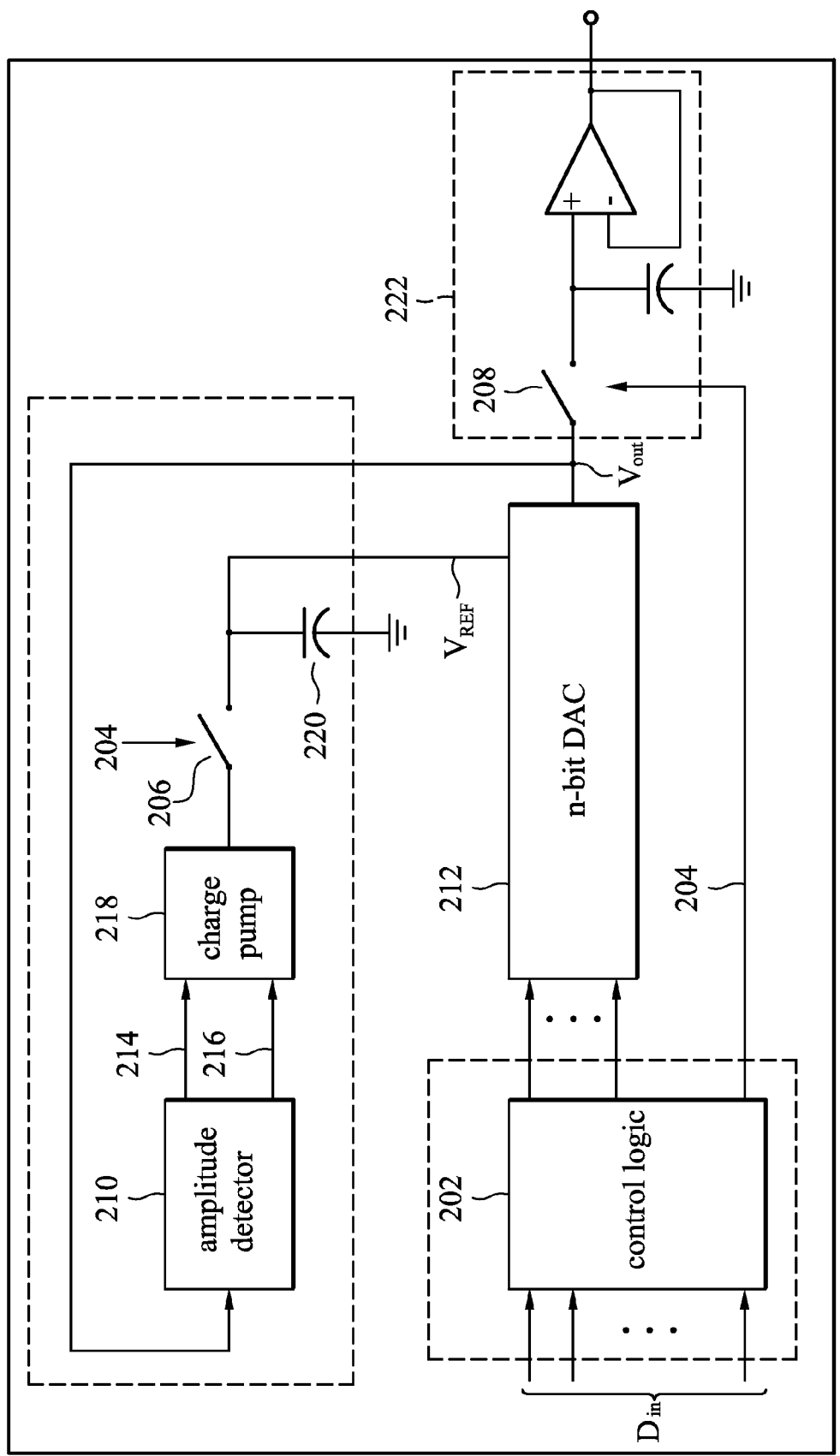
FIG. 2 depicts another conventional DAC.

Compared with the conventional technique of FIG. 2, the technique of this application does not need a capacitor (comparing to the capacitor 220 of FIG. 2 with current leakage), so that the DAC of the application is not limited to periodic self-calibration. Instead, the self-calibration of the DAC of this application may be designed merely at the start of the DAC procedure. Conventional techniques, such as U.S. Pat. No. 6,157,332, however, requires periodic self-calibration. The conventional techniques may only be applied in video DACs of image display systems. The periodic self-calibration procedure of the conventional DACs is processed by periodic synchronization periods, such as horizontal/vertical synchronizations, of image display systems. However, the DAC of this application is not limited to video DACs, and may be applied in other electronic devices.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A digital to analog converter (DAC), comprising:
    a self-calibration signal generator receiving an output voltage of the DAC to generate a self-calibration signal;
    a constant current generator determining a value of a constant current;
    a first current provider, comprising a plurality of first current generating elements, and receiving the self-calibration signal, when the DAC is in a self-calibration mode, to determine amount of the first current generating elements coupling to the constant current generator to provide the constant current, wherein the first current provider further outputs a control voltage at connected control terminals of the first current generating elements;
    a second current provider, comprising a plurality of second current generating elements which are controlled by the control voltage, and receiving a digital code to determine the actual working ones of the second current generating elements to generate an output current; and
    a current to voltage converter, converting the output current to the output voltage,
    wherein the self-calibration signal generator generates the self-calibration signal by a comparing procedure.

2. The DAC as claimed in claim 1, wherein the self-calibration signal generator generates the self-calibration signal by comparing the output voltage with an upper limit and an lower limit, wherein the upper and lower limits of the output voltage are dependent on the digital code.

3. The DAC as claimed in claim 2, wherein the self-calibration signal generator comprises:
    a reference voltage generator generating the upper and lower limits of the output voltage; and
    a comparing circuit comparing the output voltage with the upper and lower limits of the output voltage to generate the self-calibration signal.

4. The DAC as claimed in claim 3, wherein the digital code is set to a specific value when the DAC is in the self-calibration mode and the reference voltage generator comprises:
    a bandgap reference voltage generator generating a bandgap reference voltage; and
    a boost/buck circuit boosting or bucking the bandgap reference voltage to generate the output voltage upper or lower limits.

5. The DAC as claimed in claim 2, wherein the number of the first current generating elements that are coupled to the constant current generator is increased by the self-calibration signal when the output voltage is greater than the upper limit of the output voltage, and the number of the first current generating elements that are coupled to the constant current generator is decreased by the self-calibration signal when the output voltage is lower than the lower limit of the output voltage.

6. The DAC as claimed in claim 1, wherein the first and second current generating elements are formed into a current mirror structure.

7. The DAC as claimed in claim 1, wherein the first current provider further comprises a first switching circuit selectively coupling the first current generating elements to the constant current generator according to the self-calibration signal.

8. The DAC as claimed in claim 1, wherein the second current provider further comprises a second switching circuit for setting the number of the actual working second current generating elements coupled to the current to voltage converter according to the digital code.

9. The DAC as claimed in claim 1, further comprising a multiplexer operative to provide a specific digital code for the DAC to replace the digital code when the DAC is in the self-calibration mode.

* * * * *